United States Patent [19]

Botez et al.

[11] Patent Number: 4,860,298
[45] Date of Patent: Aug. 22, 1989

[54] PHASED-LOCKED ARRAY OF SEMICONDUCTOR LASERS USING CLOSELY SPACED ANTIGUIDES

[76] Inventors: Dan Botez, 234 Paseo de las Delicias, Redondo Beach, Calif. 90277; Luke J. Mawst, 22213 Redbeam Ave., Torrance, Calif. 90505

[21] Appl. No.: 180,415

[22] Filed: Apr. 12, 1988

[51] Int. Cl.$^4$ ................................................ H01S 3/19
[52] U.S. Cl. ...................................... 372/45; 372/46; 372/48; 372/50
[58] Field of Search ..................... 372/45, 46, 50, 48

[56] References Cited

U.S. PATENT DOCUMENTS

| | | | |
|---|---|---|---|
| 4,215,319 | 7/1980 | Botez | 372/46 |
| 4,547,396 | 10/1985 | Botez et al. | 427/87 |
| 4,692,925 | 9/1987 | Botez | 372/46 |
| 4,723,252 | 2/1988 | Botez et al. | 372/48 |

OTHER PUBLICATIONS

D. Botez & D. E. Ackley, "Phase-Locked Arrays of Semiconductor Diode Lasers", IEEE Cir. & Dev., vol. 2, No. 1, pp. 8–17 (1986).
D. Botez, "Single-Mode Lasers for Optical Communications", IEE Proc., vol. 129, Pt. 1, No. 6, pp. 237–251, (Dec. 1982).

Primary Examiner—James W. Davie
Attorney, Agent, or Firm—Noel F. Heal

[57] ABSTRACT

A semiconductor laser diode array in which the lasing elements are formed as parallel negative-index waveguides, to provide operation at higher powers and in one of two stable array modes. Lasing in interelement regions, between the lasing elements, is suppressed by the inherently low transverse optical confinement factor provided by high-index semiconductor material in the interelement regions, and may be further suppressed by the use of an active layer that extends only through the lasing elements and not through the interelement regions. A desired array mode may be selected by the use of a structure favoring 0°-phase-shift array modes, such as a wide-waveguide interferometric structure. Both liquid-phase epitaxy (LPE) and metalorganic chemical vapor deposition (MOCVD) processes may be used in fabrication of the device.

23 Claims, 5 Drawing Sheets

PHASED-LOCKED ARRAY OF SEMICONDUCTOR LASERS USING CLOSELY SPACED ANTIGUIDES

BACKGROUND OF THE INVENTION

This invention relates generally to semiconductor diode lasers and, more particularly, to one dimensional arrays of semiconductor diode lasers operated in a phase-locked relationship to provide high output optical power and a desirable far-field radiation pattern. Single-element diode lasers are limited in in power to outputs of the order of 30 milliwatts (mW), but arrays of diode lasers can be designed to provide output powers of hundreds of milliwatts. Such high power outputs are useful in optical communications systems, laser printers and other applications.

A survey of the state of the art of phaselocked laser arrays can be found in a paper entitled "Phase-Locked Arrays of Semiconductor Diode Lasers," by Dan Botez and Donald Ackley, IEEE Circuits and Devices Magazine, Vol. 2, No. pp. 8–17, January 1986.

By way of general background, a semiconductor diode laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forward-biased in normal operation, electrons and holes recombine in the region of the active layer, and light is emitted. The layers on each side of the active layer have a lower index of refraction than the active layer, and function as cladding layers in a dielectric waveguide that confines the light in a direction perpendicular to the layers. Various techniques are usually employed to confine the light in a lateral direction as well, and crystal facets are located at opposite ends of the structure, to provide for repeated reflections of the light back and forth in a longitudinal direction in the structure. If the diode current is above a threshold value, lasing takes place and light is emitted from one of the facets, in a direction generally perpendicular to the emitting facet.

Various approaches have been used to confine the light in a lateral sense within a semiconductor laser, i.e. perpendicular to the direction of the emitted light and within the plane of the active layer. If a narrow electrical contact is employed to supply current to the device, the lasing action will be limited to a correspondingly narrow region, in a process generally referred to as "gain guiding." At high powers, gain-guided devices have strong instabilities and produce highly astigmatic, double-peaked beams. For most high-power semiconductor laser applications there is also a requirement for a diffraction-limited beam, i.e. one whose spatial spread is limited only by the diffraction of light, to a value roughly proportional to the wavelength of the emitted light divided by the width of the emitting source. Because of the requirement for a diffraction-limited beam, most research in the area has been directed to index-guided lasers. In these, various geometries are employed to introduce dielectric waveguide structures for confining the laser light in a lateral sense, i.e. perpendicular to the direction of light emission and generally in the same plane as the active layer.

Most semiconductor structures employed for lateral index guiding in laser arrays are known as positive-index guides, i.e. the refractive index is highest in regions aligned with the laser elements and falls to a lower value in regions between elements, thereby effectively trapping light within the laser elements. Another type of index guiding is referred to as negative-index guiding, or antiguiding, wherein the refractive index is lowest in the regions aligned with the laser elements and rises to a higher value between elements. Some of the light encountering the higher refractive index material will leak out of the lasing element regions; hence the term leaky-mode laser array is sometimes applied. A leaky-mode array is described in "High-power leaky-mode multiple-stripe laser," by D. E. Ackley and R. W. H. Englemann, Appl. Phys. Lett. 39(1), July 1, 1981. In the Ackley et al. device, multiple laser elements were spaced apart by relatively wide distances, approximately 6.5 times the laser element width, and the resulting array behaved in most respects like an unrelated set of single antiguides.

In general, an array of laser emitters can oscillate in one or more of multiple possible configurations, known as array modes. In what is usually the most desirable array mode, all of the emitters oscillate in phase. This is known as the 0°-phase-shift array mode, and it produces a far-field pattern in which most of the energy is concentrated in a single lobe whose width is limited, ideally, only by the diffraction of light. When adjacent laser emitters are 180° out of phase, the array operates in the 180°-phase-shift array mode, and produces two relatively widely spaced lobes in the far-field distribution pattern. Multiple additional modes exist between these two extremes, depending on the phase alignment of the separate emitters, and in general there are N possible array modes for an N-element array. Many laser arrays operate in two or three array modes simultaneously and produce one or more beams that are typically two or three times wider than the diffraction limit.

One way to increase the power output of a laser array is to operate it at high current drive levels well above the lasing threshold. However, there is currently a limitation that precludes such operation. When evanescently-coupled devices that operate in the fundamental array mode at threshold level are driven in excess of 50% above threshold, their beams broaden, as a result of an effect known as spatial hole burning, and stable array-mode operation cannot be achieved. By providing for strong optical-mode confinement, using positive-index guiding for the elements, spatial hole burning is effectively suppressed, but so is the evanescent coupling between elements. Then, interelement coupling has to be provided via Y-shaped branches. However, Y-branch coupling is relatively weak and results in emitted beams that are as much as four times larger than the diffraction limit.

Accordingly, there is a need for a device having both strong mode confinement and strong interelement coupling, to provide operation at higher powers without spatial hole burning and with a desirable far-field distribution pattern. The present invention is directed to this end.

SUMMARY OF THE INVENTION

The present invention resides in an array of closely spaced semiconductor laser diodes that are strongly coupled but employ real-index antiguiding between elements. Index-guiding is conventionally achieved by means of positive-index waveguides to laterally confine light within elements of an array. That is to say, the refractive index is higher at each lasing element than it is between elements. In negative-index guides, or antiguides, the refractive index is made lower in the region of each element than it is between elements. The use of antiguides still provides strong optical mode confinement for the elements, but also provides strong coupling between elements. The antiguides are closely spaced such that leaked radiation is trapped among them and fed back into the antiguides, and the array modes have negligible loss, compared to a single antiguide.

Briefly, and in general terms, the device of the invention includes means for producing lasing action in a semiconductor structure, including a substrate, an active semiconductor layer, electrodes for applying a voltage across the active layer, and a pair of reflective facets, at least one of which is an emitting facet, located at opposite ends of the array structure; and an array of closely spaced negative-index waveguides with parallel longitudinal axes, formed in the structure and including semiconductor structural means disposed between the waveguides to provide interelement regions of increased refractive index. The transverse optical-mode confinement factor between waveguide elements is relatively low, to suppress lasing between elements, but coupling between elements is still strong, the so-called leaky-wave coupling, and provides stable, phaselocked operation in a desirable array mode.

The semiconductor laser array structure of the invention may further comprise means for favoring operation in a selected array mode. This latter means may include a wide-waveguide interferometric structure favoring operation at lower-order array modes, or any other type of interferometric structure favoring fundamental-array-mode operation.

The array structure may also include means for further suppressing lasing in the interelement regions. This may take the form of a semiconductor structure in which the active layer is present only in the waveguide elements but not in the interelement regions. The means for further suppressing lasing may also include the wide-waveguide interferometric structure.

The array structure of the invention may be fabricated using liquid-phase epitaxy (LPE) or metalorganic chemical vapor deposition (MOCVD), or a combination of both. The MOCVD process has the advantage that it not only facilitates omission of the active layer in the interelement regions, but also allows the use of quantum well active regions, for further improved power performance.

It will be appreciated from the foregoing that the present invention represents a significant advance in semiconductor diode arrays. In particular, the invention provides an array of high output optical power without spatial hole burning, but with strong interelement coupling, strong optical confinement within the lasing elements, and the ability to select the fundamental array mode of operation. Other aspects and advantages of the invention will become apparent from the following more detailed description, taken in conjunction with the accompanying drawings.

BRIEF DESCRIPTION OF THE DRAWINGS

FIG. 4c is a graph showing the variation of transverse optical-mode confinement factor, laterally across the array of FIG. 4a;

DESCRIPTION OF THE PREFERRED EMBODIMENTS

As shown in the drawings for purposes of illustration, the present invention is concerned with arrays of semiconductor lasers. Operation of laser arrays at drive currents well above lasing threshold can result in spatial hole burning, which broadens beams from the array, and effectively limits the output power that can be obtained in a desirable operating mode. Providing strong optical-mode confinement by positive-index guiding suppresses spatial hole burning, but also reduces coupling between devices.

In accordance with the invention, both strong optical-mode confinement and strong interelement coupling are obtained in an array of semiconductor laser diodes by employing closely spaced antiguides instead of positive-index guides for the lasing elements. The device selects and operates in a stable, diffraction-limited array mode, either the 0°-phase-shift array mode or the 180°-phase-shift array mode, even at drive currents well in excess of the lasing threshold.

Figure 1A:
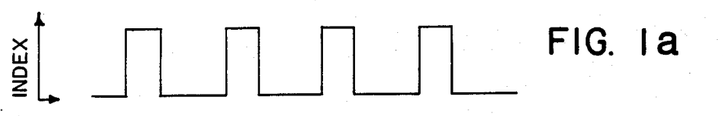
FIGS. 1a and 1b are graphs showing the variation of refractive index and optical intensity laterally across a conventional laser array employing strong positive-index guiding.
Figure 1B:
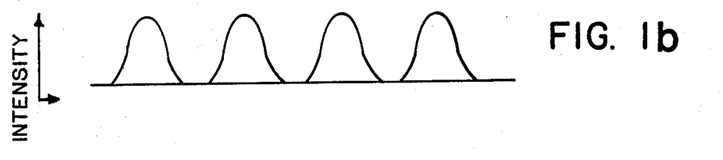
Figure 2A:
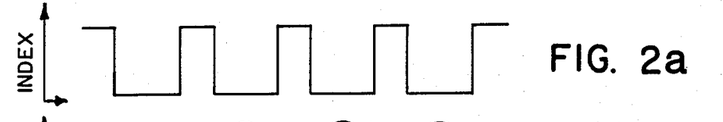
FIGS. 2a and 2b are similar graphs showing the variation of refractive index and optical intensity laterally across a laser array employing strong negative-index guiding.
Figure 2B:
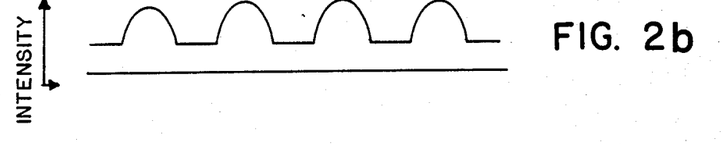

FIGS. 1a and 1b show diagrammatically the effect of a positive-index array of waveguides. As shown in FIG. 1a, in a positive-index waveguide the refractive index peaks above the array elements, and FIG. 1b shows the optical intensity also peaking above the array elements. FIGS. 2a and 2b show the corresponding variations of refractive index and optical intensity for a negative-index waveguide, or antiguide. In the negative-index waveguide, the refractive index peaks between elements and, although the optical intensity still peaks above the elements, there is a substantial intensity between elements, indicating strong coupling between them.

Figure 3A:
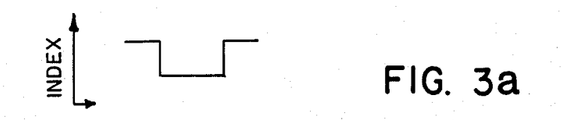
FIGS. 3a and 3b are similar graphs showing the variation of refractive index and optical intensity laterally across a single antiguide.
Figure 3B:
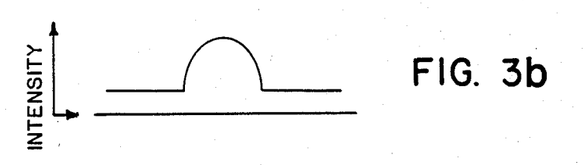

FIGS. 3a and 3b show by way of comparison the variation of refractive index and optical intensity for a single antiguide. The lowered but substantial intensity levels outside the region of the antiguide represent radiation loss. In a positive-index guide, there is practically total internal reflection when light impinges, above some threshold angle of incidence, on the interface between the higher and lower index materials making up the guide. In an antiguide, a substantial portion of the incident light is refracted into the surrounding material of higher refractive index. However, in an array of closely spaced antiguides this refracted light is not entirely lost but is trapped between antiguides and much of this trapped light finds its way back into the antiguides. Therefore, an array of closely spaced antiguides is much less lossy than a single antiguide. Theoretical calculations and experimental results have shown that the difference is as much as an order of magnitude when comparing a single antiguide with a ten-element array of closely spaced antiguides.

Figures 4A, 4B:
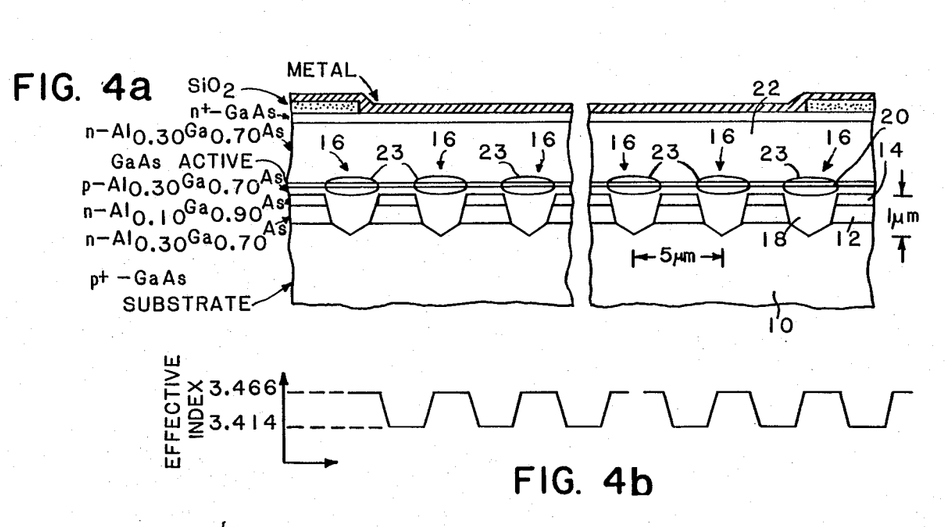
FIG. 4a is a lateral cross-sectional view through an array of laser elements employing antiguiding in accordance with the invention.
FIG. 4b is a graph showing the variation of effective refractive index laterally across the array

FIG. 4a shows an illustrative structure in accordance with the invention, as fabricated using a liquid-phase epitaxy (LPE) process. The structure includes a substrate, indicated by reference numeral 10, of p+ type gallium arsenide, on which is grown a first layer of p type aluminum gallium arsenide 12 with 30% aluminum ($Al_{0.3}Ga_{0.7}As$) and a layer of p type aluminum gallium arsenide 14 with 10% aluminum ($Al_{0.1}Ga_{0.9}As$). The resulting structure is etched to form multiple parallel channels 16 extending down at least to the substrate 10. Then a second layer 18 of p type aluminum gallium arsenide with 30% aluminum ($Al_{0.3}Ga_{0.7}As$) is formed over the structure to act as one cladding layer. On top of this is formed an active layer 20 of gallium arsenide, on which is formed a second cladding layer 22, of n type aluminum gallium arsenide with 30% aluminum, ($Al_{0.3}Ga_{0.7}As$). The oval areas 23 within each channel 16 represent lasing regions viewed in cross section.

FIG. 4b shows the effective refractive index variation laterally across the array of antiguides. The effective index increases from 3.414 in the channel regions making up the lasing elements, to 3.466 in the interelement regions.

Figure 4C:
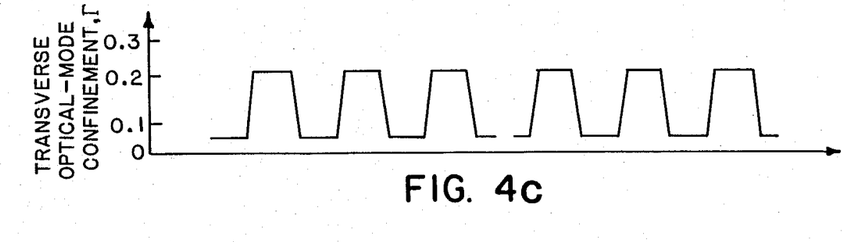

FIG. 4c shows the variation of transverse optical-mode confinement factor across the lateral width of the array. This represents the proportion of light that is confined to the active layer. In the regions of the channels, the transverse optical-mode confinement factor is relatively high, in excess of approximately 20%. In the regions between channels, the confinement factor falls sharply to approximately 5%. This low confinement factor tends to suppress lasing between the antiguide elements of the array.

As previously noted, the array of the present invention employs closely spaced antiguides rather than widely spaced antiguides. In this context, the term "closely spaced" is intended to mean that the interspacing distance between two adjacent laser elements is equal to or less than the spot size of each laser element. In the illustrative embodiment, the interspacing distance between laser elements is approximately 2 microns (micrometers) and the spot size is 3 microns. Interspacing distances up to 5 microns will probably also produce desirable results, but interspacing distances greater than 5 microns may result in unacceptable losses in the interelement regions. Spacings as small as 1 micron or less, limited only by the fabrication process, may also be used. "Closely spaced" might also be defined to mean spaced sufficiently close together to produce a single-lobed far-field pattern.

The sandwich structure between laser channels 16, comprising layers 12, 14 and 18 (FIG. 4a) performs at least two additional functions while providing a relatively high effective refractive index. First, the sandwich structure provides a positive waveguide, in a transverse sense, for light leaking out laterally from the channels 16, since the middle layer 14 has a higher refractive index than the surrounding layers 12 and 18. Secondly, the sandwich structure provides lateral confinement for electrical current carriers in the laser elements.

Figure 5:
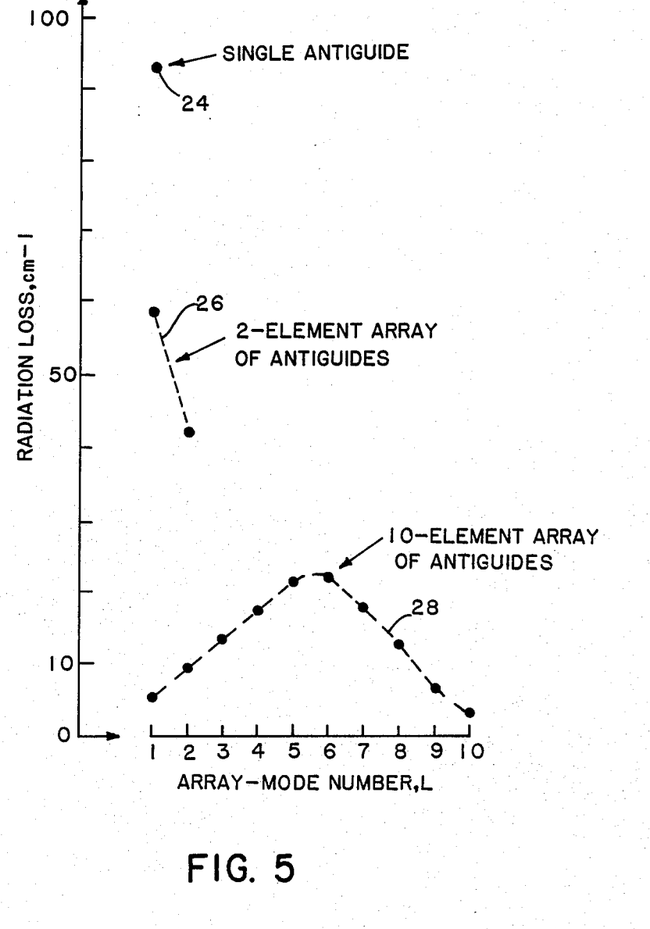
FIG. 5 is a graph showing the variation of radiation loss with array-mode number, in a single antiguide, a two-element antiguide array, and a ten-element antiguide array.

FIG. 5 plots the relationship between the radiation loss in an antiguide array and the arraymode number. The limiting case is for an "array" of a single antiguide, which has, of course, a single "array" mode. The single array has high radiation losses of over 90 $cm^{-1}$, as plotted at point 24 in the figure. A two-element array of antiguides has two possible array modes, with losses of approximately 40 $cm^{-1}$ and 60 $cm^{-1}$, respectively, as plotted on curve 26. A ten-element array has ten possible array modes, and the radiation losses associated with the modes are plotted in curve 28. The lowest losses are associated with modes 1 and 10, i.e. the fundamental or 0°-phase-shift array mode, and the 180°-phase-shift array mode, while the highest losses are associated with modes 5 and 6. Because modes 1 and 10 have the lowest losses, in fact less than one-tenth of the losses associated with a single antiguide, the device of the invention tends to naturally select one or the other of these modes. However, it is possible to inhibit one or the other of the two modes and effectively tilt the curve 28 so that a desired array mode has the lowest losses and will be selected and maintained during operation.

Figure 6:
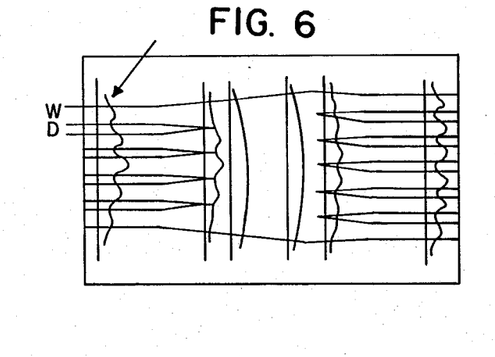
FIG. 6 is a diagrammatic plan view of a wide-waveguide interferometric structure employed in conjunction with the invention to favor operation in the fundamental array mode, and to further suppress lasing between elements.

Antiguide arrays fabricated in this manner have selected and operated in either the 0°- phase-shift array mode or the 180°-phase-shift array mode. If the in-phase mode is desired, this can be selected by using a wide-waveguide interferometric structure of the type disclosed and claimed in application Ser. No. 06/921,648, filed on Oct. 21, 1986 in the names of Dan Botez et al., assigned to TRW Inc., the same assignee as the present invention, and entitled "Laser Array with Wide-Waveguide Coupling region." As described in the referenced application, the widewaveguide structure includes two sets of waveguides separated by a single wide waveguide and offset from each other to inhibit the propagation of the 180°-phase-shift array mode from one set of waveguides to the other. FIG. 6 shows diagrammatically a wide-waveguide interferometric structure of the type that can be used in this way. A secondary function of the wide-waveguide interferometric structure is to inhibit lasing in the interelement regions of the array.

Figure 7A:
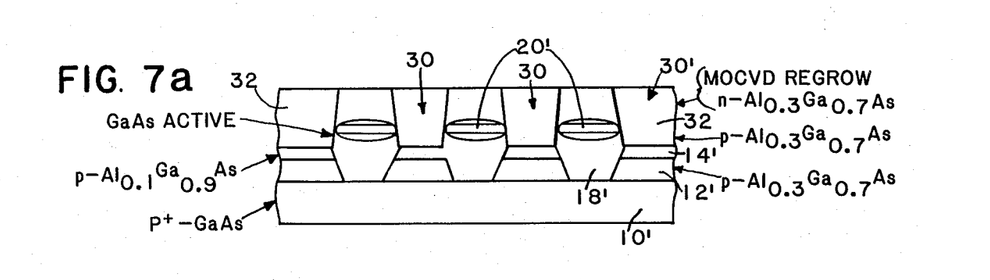
FIG. 7a is a lateral cross-sectional view of a second embodiment of the invention, similar to FIG. 4a, but employing MOCVD regrowth to effect removal of an active layer in interelement regions.

The best way to inhibit lasing in the interelement regions is to further reduce the mode confinement factor between elements, such as by completely removing the active layer between elements. This can be done either by etching away the layer between elements and then regrowing by some other process, such as metalorganic chemical vapor deposition (MOCVD), or by fabricating the entire structure by MOCVD. FIG. 7a shows by way of further example, an embodiment of the invention in which the active layer has been removed between antiguides by etching away the active layer and adjacent portions of the cladding layers, to form slots 30 between the antiguides. The slots are then regrown by MOCVD, with an n type layer 32 of $Al_{0.3}Ga_{0.7}As$.

Figure 7B:
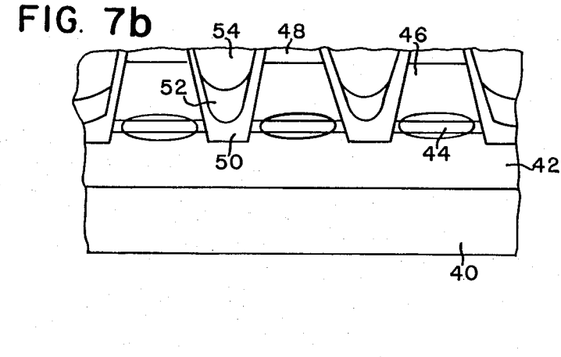
FIG. 7b is a lateral cross-sectional view of a third embodiment of the invention, employing MOCVD to fabricate the entire structure.

FIG. 7b shows another embodiment of the invention, formed entirely by the MOCVD process. This has the advantage that quantum well structures may be employed, and higher power levels can be achieved as a consequence. The structure includes a substrate 40 of n+ type gallium arsenide on which is formed a first cladding layer 42 of n type $Al_{0.40}Ga_{0.60}As$, then, in a quantum-well active region, an active layer 44 of gallium arsenide and two light-confining layers of $Al_{0.20}Ga_{0.80}As$ (not shown), a second cladding layer 46 of p type $Al_{0.40}Ga_{0.60}As$, capped with a layer 48 of p+ type gallium arsenide for electrical contact. It will be understood that the quantum-well regions may include multiple quantum wells rather than a single one. Between active regions, the structure is filled with a 30%-10%-30% "sandwich" of aluminum gallium arsenide, including a first layer of $Al_{0.30}Ga_{0.70}As$ 50, a middle layer 52 of $Al_{0.10}Ga_{0.90}As$, and a second layer 54 of $Al_{0.30}Ga_{0.70}As$. This interelement structure has the same effect as the interelement structure in the embodiment of FIG. 7(a), i.e. the inhibition of lasing in the interelement regions. The use of the MOCVD process also permits quantum-well structures and increased power levels, especially in CW (continuous-wave) operation.

Figure 8A:
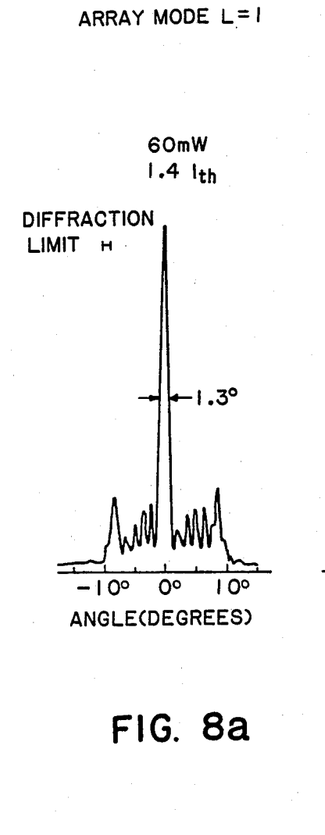
FIGS. 8a-8c are graphs showing the far field radiation patterns produced by the laser array of the invention, operating at output powers of 60 mW, 105 mW and 200 Mw, respectively.
Figure 8B:
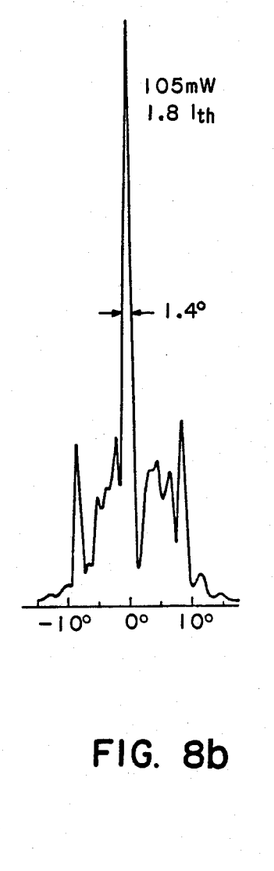
Figure 8C:
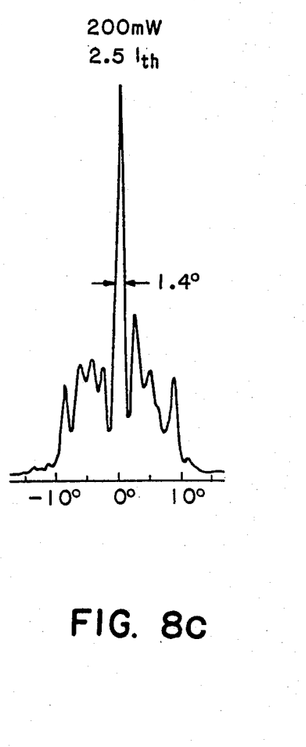

As shown in FIGS. 8a–8c, the closely spaced antiguide array of the invention can be operated in the fundamental array mode, to produce a predominantly single-lobed far-field pattern and a diffractionlimited beam at high powers, shown up to 200 mW.

It will be appreciated from the foregoing that the present invention represents a significant advance in the field of phase-locked semiconductor laser arrays. In particular, the invention provides strong optical mode confinement within each laser element without sacrificing strong coupling between elements. The array structure of the invention includes multiple closely spaced antiguides and has a relatively low transverse optical confinement factor between elements, which suppresses lasing between the antiguide elements. Interelement lasing can be further suppressed by removing portions of the active layer between elements, or by employing a wide-waveguide interferometric structure. The array structure operates in either the fundamental array mode (0°-phase-shift mode) or in the 180°-phase-shift array mode. The fundamental mode can be selected by using the wide-waveguide interferometric structure, or any other means favoring lower-order array modes.

It will also be appreciated that, although a number of different embodiments of the invention have been described in detail for purposes of illustration, various modifications may be made without departing from the spirit and scope of the invention. Accordingly, the invention is not to be limited except as by the appended claims.

We claim:

1. A semiconductor laser array structure comprising:
   means for producing lasing action in a semiconductor structure, including a substrate, an active semiconductor layer, electrodes for applying a voltage across the active layer, and a pair of reflective facets, at least one of which is an emitting facet, located at opposite ends of the array structure; and
   an array of closely spaced negative-index waveguides with parallel longitudinal axes, formed in the structure and defined by parallel waveguide elements having a selected refractive index, and semiconductor structural means between the waveguide elements to provide interelement regions of higher refractive index than the waveguide elements, whereby optical confinement between waveguide elements is relatively low, to suppress lasing between elements, but coupling between elements is strong, to provide stable, phase-locked operation.

2. A semiconductor laser array structure as defined in claim 1, and further comprising:
   means for favoring operation in a selected array mode exclusively.

3. A semiconductor laser array structure as defined in claim 2, wherein:
   the means for favoring operation in a selected array mode includes an interferometric structure favoring operation at 0° phase-shift array modes.

4. A semiconductor laser array structure as defined in claim 1, and further comprising:
   means for further suppressing lasing in the interelement regions.

5. A semiconductor laser array structure as defined in claim 4, wherein the means for further suppressing lasing includes:
   a semiconductor structure in which the active layer is present only in the waveguide elements but not in the interelement regions.

6. A semiconductor laser array structure as defined in claim 4, wherein the means for further suppressing lasing includes:
   an interferometric structure.

7. A semiconductor laser array structure capable of operation at high drive currents and in a fundamental array mode, the structure comprising:
   an array of semiconductor laser elements formed as parallel optical antiguides in a layered semiconductor structure, the optical antiguides including an array of parallel waveguide elements having a selected refractive index and semiconductor structural means disposed between the waveguide elements to provide regions of higher refractive index than the waveguide elements and decreased transverse optical mode confinement;
   whereby optical lasing is effectively confined to the waveguide elements, while maintaining strong interelement coupling.

8. A semiconductor laser array structure as defined in claim 7, and further comprising:
   means for further suppressing lasing in interelement regions between the antiguides.

9. A semiconductor laser array structure as defined in claim 8, wherein:
   the means for further suppressing lasing in the interelement regions includes an active layer extending only through the antiguides and not through the interelement regions.

10. A semiconductor laser array structure as defined in claim 8, wherein:
    the means for further suppressing lasing in the interelement regions includes a wide-waveguide interferometric structure.

11. A semiconductor laser array structure as defined in claim 7 and further comprising:
    means for favoring operation in the 0°-phase-shift array mode.

12. A semiconductor laser array structure as defined in claim 11, wherein:

the means for favoring operation in the 0°-phase-shift array mode includes a wide-waveguide interferometric structure.

13. A semiconductor laser array structure as defined in claim 1, wherein the semiconductor structural means between the negative-index waveguides includes:
an inner layer of semiconductor material, sandwiched between two outer layers of semiconductor material, wherein the inner layer has a higher refractive index than the outer layers, to provide an increased effective refractive index in the interelement regions.

14. A semiconductor laser array structure capable of operation at high drive currents and in a fundamental array mode, the structure comprising:
a semiconductor substrate;
a semiconductor diode structure, including an active layer formed between two cladding layers of opposite polarity types on the substrate;
means for applying an electrical current across the active layer to initiate and maintain lasing;
semiconductor structural means formed on the substrate to define an array of parallel waveguide elements of selected refractive index, and an array of parallel interelement regions having a higher refractive index than the waveguide elements and a relatively low transverse optical confinement factor, to suppress lasing in the interelement regions and confine lasing to the array of waveguide elements, operating as antiguides; and
means for further suppressing lasing in the interelement regions;
whereby the array exhibits strong optical confinement within its elements and strong interelement coupling, and operates phase-locked in a stable array mode.

15. A semiconductor laser array structure as defined in claim 14, and further comprising:
means for favoring operation in the 0°-phase-shift array mode.

16. A semiconductor laser array structure as defined in claim 15, wherein the means for favoring operation in the 0°-phase-shift array mode includes:
a second set of waveguides with parallel longitudinal axes; and
a wide-waveguide section, having one end coupled to the first set of waveguides and an opposite end coupled to the second set of waveguides, and having a width approximately equal to the combined width of one of the first and second sets of waveguides;
and wherein the individual waveguides in one set are not colinear with the waveguides in the other set.

17. A semiconductor laser array structure as defined in claim 14, wherein:
the means for further suppressing lasing in the interelement regions includes a limited-area active layer that extends only through the lasing elements and not through the interelement regions.

18. A semiconductor laser array structure as defined in claim 17, wherein:
the limited-area active layer is formed by a combination liquid phase epitaxy (LPE) and metal-organic chemical vapor deposition (MOCVD).

19. A semiconductor laser array structure as defined in claim 17, wherein:
the structure is formed entirely by metal-organic chemical vapor deposition (MOCVD).

20. A semiconductor laser array structure as defined in claim 14, wherein:
the semiconductor structural means defining the interelement regions includes at least one layer of semiconductor material of higher refractive index than the cladding layers.

21. A semiconductor laser array structure as defined in claim 14, wherein the semiconductor structural means between the waveguide elements includes:
an inner layer of semiconductor material, sandwiched between two outer layers of semiconductor material, wherein the inner layer has a higher refractive index than the outer layers, to provide an increase effective refractive index in the interelement regions.

22. A semiconductor laser array structure as defined in claim 14, wherein:
the interelement regions are no wider than the waveguide elements.

23. A semiconductor laser array structure as defined in claim 22, wherein:
the interelement regions have a width in the range of approximately 1 to 5 microns.

* * * * *